US008486752B2

(12) United States Patent
Chang

(10) Patent No.: US 8,486,752 B2
(45) Date of Patent: Jul. 16, 2013

(54) PHASE CHANGE MEMORY DEVICE HAVING DIELECTRIC LAYER FOR ISOLATING CONTACT STRUCTURE FORMED BY GROWTH, SEMICONDUCTOR DEVICE HAVING THE SAME, AND METHODS FOR MANUFACTURING THE DEVICES

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 240 days.

(21) Appl. No.: 12/949,275

(22) Filed: Nov. 18, 2010

(65) Prior Publication Data
US 2011/0059591 A1 Mar. 10, 2011

Related U.S. Application Data

(62) Division of application No. 12/330,068, filed on Dec. 8, 2008, now Pat. No. 7,858,960.

(30) Foreign Application Priority Data

Oct. 10, 2008 (KR) .......................... 10-2008-0099559

(51) Int. Cl.
*H01L 21/06* (2006.01)
(52) U.S. Cl.
USPC ............... 438/102; 438/696; 257/2; 257/5; 257/E27.004; 257/E45.002
(58) Field of Classification Search
USPC ............... 438/102, 696; 257/2, 5, E27.004, 257/E45.002
See application file for complete search history.

(56) References Cited

U.S. PATENT DOCUMENTS

| 6,121,164 | A | 9/2000 | Yieh et al. |
| 7,651,906 | B2 | 1/2010 | Park et al. |
| 7,696,508 | B2 * | 4/2010 | Song et al. ............... 257/4 |
| 7,803,679 | B2 * | 9/2010 | Park et al. ............. 438/237 |
| 7,834,340 | B2 * | 11/2010 | Kim ....................... 257/3 |
| 7,871,906 | B2 * | 1/2011 | Lee et al. ............. 438/478 |
| 7,880,123 | B2 * | 2/2011 | Kim et al. ............ 219/497 |
| 8,039,828 | B2 * | 10/2011 | Park et al. ............... 257/2 |
| 2010/0117046 | A1 * | 5/2010 | Chang et al. ............. 257/3 |

FOREIGN PATENT DOCUMENTS

| KR | 1020080002063 A | 1/2008 |
| KR | 1020080078972 A | 8/2008 |

OTHER PUBLICATIONS

USPTO OA mailed Apr. 29, 2010 in connection with U.S. Appl. No. 12/330,068.
USPTO OA mailed Aug. 19, 2010 in connection with U.S. Appl. No. 12/330,068.

* cited by examiner

*Primary Examiner* — Zandra Smith
*Assistant Examiner* — Toniae Thomas
(74) *Attorney, Agent, or Firm* — Ladas & Parry LLP

(57) ABSTRACT

A phase change memory device includes a semiconductor substrate having an impurity region and an interlayer dielectric applying a tensile stress formed on the semiconductor substrate and having contact holes exposing the impurity region. Switching elements are formed in the contact holes; and sidewall spacers interposed between the switching elements and the interlayer dielectric and formed as a dielectric layer applying a compressive stress.

10 Claims, 5 Drawing Sheets

PHASE CHANGE MEMORY DEVICE HAVING DIELECTRIC LAYER FOR ISOLATING CONTACT STRUCTURE FORMED BY GROWTH, SEMICONDUCTOR DEVICE HAVING THE SAME, AND METHODS FOR MANUFACTURING THE DEVICES

CROSS-REFERENCES TO RELATED APPLICATION

The present application claims priority under 35 U.S.C. §119(a) to Korean application number 10-2008-0099559, filed on Oct. 10, 2008, in the Korean Intellectual Property Office, which is incorporated herein by reference in its entirety as set forth in full.

BACKGROUND

1. Technical Field

The present invention relates generally to a semiconductor device and a method for manufacturing the same, and more particularly, to a phase change memory device having a dielectric layer for isolating contact structures formed by growth, a semiconductor device having the same, and methods for manufacturing the devices.

2. Related Art

Semiconductor memory devices include, among others, a dynamic random access memory (DRAM), a static random access memory (SRAM), and a flash memory. These semiconductor memory devices are generally classified into volatile memory devices and nonvolatile memory devices. The volatile memory device is not capable of retaining the data stored therein when a power supplied to the memory is interrupted. In contrast, the nonvolatile memory device is capable of retaining data stored therein when a power supplied to the memory is interrupted, and therefore the nonvolatile memory device, and particularly the flash memory, is used for storing data. However, utilizing the flash memory for storing data has disadvantages in that it takes a long time to read and write data.

To overcome the above mentioned problems associated with the flash memory, several types of semiconductor memory including a ferro-electric RAM (FRAM), a magnetic RAM (MRAM), and a phase change RAM (PRAM) (hereinafter referred to as a "phase change memory device") have been proposed in the art.

The phase change memory device includes a phase change material. For example, the phase or state of the phase change material can be changed between a crystalline state and an amorphous state upon the application of heat thereto, with the crystalline state having a resistance that is different than that of the amorphous state. The phase change material can be used as a storage medium in a memory device because the difference in resistance can be used to define the "states" of information (e.g., the different resistance may be used to define a logic '0' state or a logic '1' state). Accordingly, the phase change memory device is capable of performing a data reading operation by storing a data value therein.

A typical phase change memory device includes switching elements for selectively applying heat to the phase change material. The heat may be applied to the phase change material by applying a current to the phase change material. For example, the switching elements may be implemented using MOS transistors, bipolar transistors, diodes, or the like. PN diodes are often used as the switching elements in a phase change memory device in consideration of the area occupied by the switching elements.

When PN diodes are used as the switching elements, the PN diodes are vertically formed in an interlayer dielectric formed on a semiconductor substrate. The PN diodes may be formed through selective epitaxial growth (SEG) by employing the semiconductor substrate as a seed. Typically, a high density plasma (HDP) dielectric layer having excellent isolation and layer characteristics is used for isolating the PN diodes from each other.

Since the PN diodes have a vertical structure, the interlayer dielectric for isolating the PN diodes must be formed to a height corresponding to that of the PN diodes, for example, 2,000 Å or more.

In this regard, if the HDP dielectric layer, which constitutes the interlayer dielectric, is deposited as a thick layer having a thickness of 2,000 Å or over, the HDP dielectric layer applies compressive stress to the semiconductor substrate, which is composed of a silicon component. Due to the application of the compressive stress, the interlayer dielectric is likely to lift or peel from the semiconductor substrate, which results in a leakage current.

The interlayer dielectric is formed not only in a cell region, in which the PN diodes are formed, but also in a peripheral circuit region, in which driving transistors are formed. When HDP dielectric layer is formed over the driving transistors the driving characteristics of the MOS transistors are likely to deteriorate due to the compressive stress applied to the driving transistors by the HDP dielectric layer.

When defining contact holes for delimiting PN diode regions, stacking faults are likely to occur at the interfaces of the contact holes if the interlayer dielectric comprises a dielectric layer applying low compressive stress, for example, a tensile stress applying dielectric layer. In other words, when etching the tensile stress applying dielectric layer, a substantial amount of lattices are likely to be lost on the etching surfaces, that is, at the interfaces of the contact holes, resulting in the stacking faults. When SEG for forming the PN diodes is conducted with the stacking faults occurring in this way, portions where the stacking faults occurred serve as trap sites. As a consequence, the electrical reliability of the phase change memory device cannot be ensured because the PN diodes cannot be grown as a single crystal layer and have defects.

SUMMARY

In one embodiment of the present invention, a phase change memory device comprises a semiconductor substrate having an impurity region; a tensile stress applying interlayer dielectric formed on the semiconductor substrate and having contact holes which open the impurity region; switching elements formed in the contact holes; and sidewall spacers interposed between the switching elements and the interlayer dielectric and formed as a compressive stress applying dielectric layer.

In another embodiment, a phase change memory device comprises a semiconductor substrate having an impurity region; a first interlayer dielectric formed on the semiconductor substrate and having contact holes which expose predetermined portions of the impurity region; sidewall spacers formed on sidewalls of the contact is holes of the first interlayer dielectric; PN diodes filled in the contact holes; a second interlayer dielectric formed on the PN diodes and including heater electrodes which are electrically connected with the PN diodes; phase change patterns formed on the second interlayer dielectric and electrically contacting the heater electrodes; and top electrodes formed on the phase change patterns, wherein the first interlayer dielectric is formed as a dielectric layer which applies tensile stress to the semiconductor substrate, and the side wall spacers are formed as a dielectric layer which applies compressive stress to the semiconductor substrate.

In another embodiment, a semiconductor device comprises a semiconductor substrate having a conductive region; a tensile stress applying interlayer dielectric formed on the semiconductor substrate and having contact holes which open the conductive region; a conductive layer formed in the contact holes; and sidewall spacers interposed between the conductive layer and the interlayer dielectric and formed as a compressive stress applying dielectric layer.

In another embodiment, a method for manufacturing a phase change memory device comprises the steps of forming a tensile stress applying interlayer dielectric on a semiconductor substrate which is formed with an impurity region; defining contact holes which expose the impurity region, by patterning predetermined portions of the tensile stress applying interlayer dielectric; forming sidewall spacers on sidewalls of the contact holes, as a compressive is stress applying dielectric layer; and forming switching elements in the contact holes.

In still another embodiment, a method for manufacturing a phase change memory device comprises the steps of forming an interlayer dielectric on a silicon-containing substrate which is formed with an impurity region, to apply tensile stress to the silicon-containing substrate; defining contact holes which expose the impurity region, by patterning predetermined portions of the interlayer dielectric; forming sidewall spacers on sidewalls of the contact holes, as a dielectric layer which applies compressive stress to the silicon-containing substrate; forming a single crystal layer through SEG employing exposed portions of the impurity region as seeds, to partially fill the contact holes; forming an amorphous silicon layer on the single crystal layer to completely fill the contact holes; forming a single crystal epitaxial layer by annealing the single crystal layer and the amorphous silicon layer; planarizing the single crystal epitaxial layer until the interlayer dielectric is exposed; and forming PN diodes by implanting impurities into the single crystal epitaxial layer.

In a still further embodiment, a method for manufacturing a semiconductor device comprises the steps of preparing a semiconductor substrate having an impurity region; forming a tensile stress applying interlayer dielectric on the semiconductor substrate; defining contact holes by etching predetermined portions of the tensile stress applying interlayer dielectric; forming sidewall spacers on sidewalls of the contact holes as a compressive stress applying dielectric layer; and filling a conductive layer in the contact holes.

BRIEF DESCRIPTION OF THE DRAWINGS

The above aspects and other features and advantages will become more apparent after a reading of the following detailed description taken in conjunction with the drawings, in which.

DETAILED DESCRIPTION

Hereafter, exemplary embodiments will be described with reference to the accompanying drawings.

Figure 1:
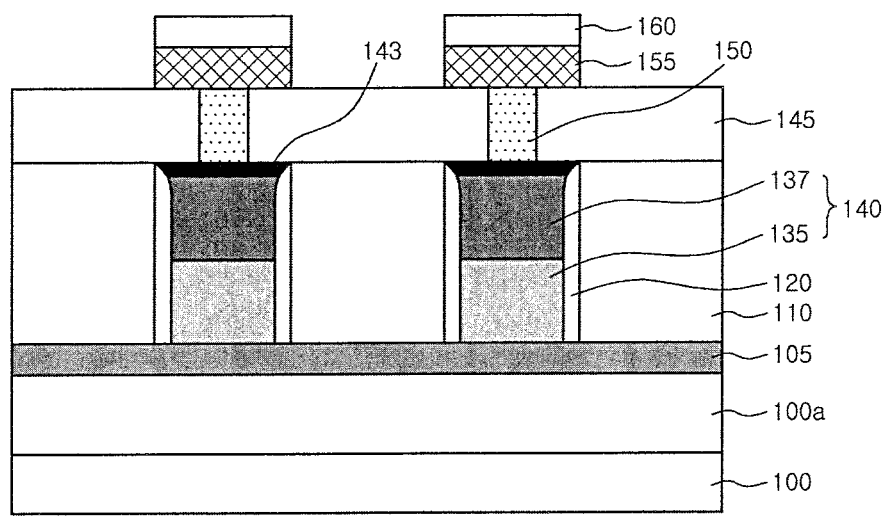
FIG. 1 is a cross-sectional view of an phase change memory device according to an embodiment of the present invention.

Referring to FIG. 1, a phase change memory device according to an embodiment of the present invention is formed on a semiconductor substrate 100. According to the present embodiment is the phase change memory device may include switching elements 140, a first interlayer dielectric 110, which isolates the switching elements 140, heater electrodes 150, phase change patterns 155, and top electrodes 160.

The semiconductor substrate 100 may comprise a silicon wafer, a silicon-germanium wafer, an silicon-on-insulator (SOI) substrate, or the like. In order to provide optimal drivability, the semiconductor substrate 100 can be formed with a well, for example, a P-well 100a, and an N-type impurity region 105 may be formed in the P-well 100a.

The first interlayer dielectric 110 may be formed to a sufficient thickness, for example, in the range of 1,500~3,000 Å, to cover the surface of the semiconductor substrate 100. In the present embodiment, the first interlayer dielectric 110 may comprise a tensile stress applying dielectric layer having an excellent adhesion property with respect to the surface of the semiconductor substrate 100, for example, the tensile strength applying dielectric layer may include one of a borophosphor silicate glass (BPSG), a phosphor silicate glass (PSG), an undoped silicate glass (USG), and a flowable oxide (FOX).

The switching elements 140 are formed in the first interlayer dielectric 110. The switching elements 140 may be a single crystal epitaxial layer and may comprise PN diodes, which are composed of an N-type epitaxial layer 135 and a P-type epitaxial layer 137.

Sidewall spacers 120 may be interposed between the first interlayer dielectric 110 and the PN diodes 140. The sidewall spacers 120 are formed to prevent stacking faults from occurring at the interface between the first interlayer dielectric 110 and the PN diodes 140. The sidewall spacers 120 may comprise a compressive stress applying dielectric layer, for example, a silicon nitride layer or a silicon oxide layer. According to the present embodiment, defects in the first interlay dielectric 110 may be prevented because the sidewall spacers 120 comprising the compressive stress applying dielectric layer are formed on the junction interfaces of the first interlayer dielectric 110. Additionally, since the sidewall spacers 120 contact the semiconductor substrate 100 over relatively small areas, according to the present embodiment it is possible to prevent the occurrence of a lifting or peeling phenomenon.

The heater electrodes 150 are formed on the PN diodes 140 and are electrically connected with the PN diodes 140. According to the present embodiment an ohmic contact layer 143 may be formed between the heater electrodes 150 and the PN diodes 140. The heater electrodes 150 may be isolated from each other by a second interlayer dielectric 145. The heater electrodes 150 may be formed of a conductive material having a high specific resistance so as to have excellent heat dissipation characteristics, for example, the heater electrodes may comprise at least one of a titanium nitride layer, a titanium aluminum nitride layer, a titanium tungsten layer, a polysilicon layer, and a silicon germanium layer. The second interlayer dielectric 145 may comprise a dielectric layer having excellent heat resistance so as to intercept heat transfer.

The phase change patterns 155 may be formed on the heater electrodes 150 and the second interlayer dielectric 145, which have the above-described structures. The phase change pattern 155 may have areas substantially larger than the heater electrodes 150 and may be formed of, for example, a chalcogen compound. In the present embodiment, the phase change patterns 155 may include various GST compounds such as a GST compound containing germanium (Ge), stibium (Sb) and tellurium (Te) and a GST compound doped with carbon, nitrogen, oxygen/or a metal.

The top electrodes 160 are formed on the phase change patterns 155, and may be formed of a metal or a conductive nitride.

As is apparent from the above description, in the phase change memory device according to the present embodiment, a dielectric layer structure for isolating the PN diodes 140 comprises the tensile stress applying dielectric layer and the sidewall spacers 120. The sidewall spacers 120 contact the contact interfaces of the PN diodes 140 and comprise the compressive stress applying dielectric layer. Accordingly, in the present embodiment it is possible to form the PN diodes 140 free from defects, such that the occurrence of stacking faults at the contact interfaces is prevented while also improving an adhesion property of the dielectric layer structure with respect to the semiconductor substrate 100.

FIG. 2 through 9 are cross-sectional views shown for illustrating the processes of a method for manufacturing a phase change memory device according to another embodiment of the present invention. While a method for manufacturing substantially the same phase change memory device as shown in 1 is exemplified in FIG. 2 through 9, it is to be noted that the method shown in FIG. 2 through 9 is not limited to the particular phase change memory device shown in FIG. 1.

Figure 2:
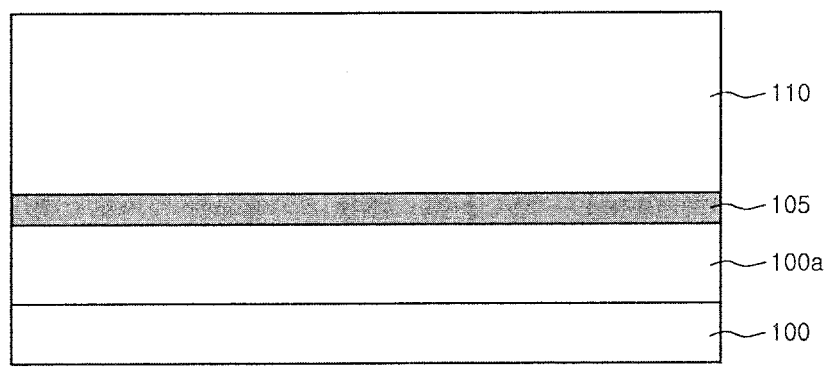
FIG. 2 through 9 are cross-sectional views shown for illustrating the processes of a method for manufacturing a phase change memory device according to another embodiment of the present invention.

Referring to FIG. 2, a well 100a is formed in a semiconductor substrate 100. The semiconductor substrate 100 may comprise a single crystal substrate such as a silicon wafer, a silicon-germanium wafer, an SOI substrate, or the like. The well 100a may be formed, for example, by implanting impurities, such as P-type impurities, into the semiconductor substrate 100 and subsequently annealing the resultant semiconductor substrate 100. An impurity region 105 is formed by implanting N-type impurities, for example, P or As ions, into the semiconductor substrate 100 formed with the well 100a at a concentration in the range of $10^{20} \sim 10^{22}$ ions/cm$^3$ with energy in the range of 10~50 KeV and subsequently annealing the resultant semiconductor substrate 100.

Next, a first interlayer dielectric 110 is formed on the semiconductor substrate 100, which is formed with the impurity region 105. The first interlayer dielectric 110 is formed to isolate is diodes, which will be subsequently formed. In the present embodiment, the first interlayer dielectric 110 may comprise a tensile stress applying dielectric layer, that is, a dielectric layer for applying tensile stress to the semiconductor substrate 100. To form the tensile stress applying dielectric layer at least one of BPSG, PSG, USG, and FOX may be employed singly or in a mixed or stacked manner. By using the tensile stress applying dielectric layer as the first interlayer dielectric 110, a lifting or peeling phenomenon can be prevented from occurring since tensile force can be applied between the first interlayer dielectric 110 and the semiconductor substrate 100.

Figure 3:
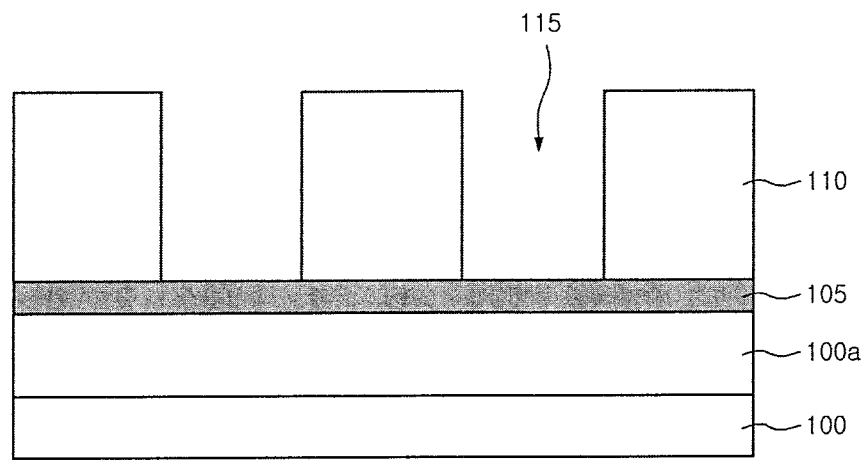

Referring to FIG. 3, contact holes 115 are defined in the first dielectric layer 110 by etching predetermined portions of the first interlayer dielectric 110 so as to expose the impurity region 105. When etching the first interlayer dielectric 110 to define the contact holes 115 therein, stacking faults are likely to occur at the interfaces of the contact holes 115 because of the tensile stress applied to the first interlayer dielectric 110.

Figure 4:
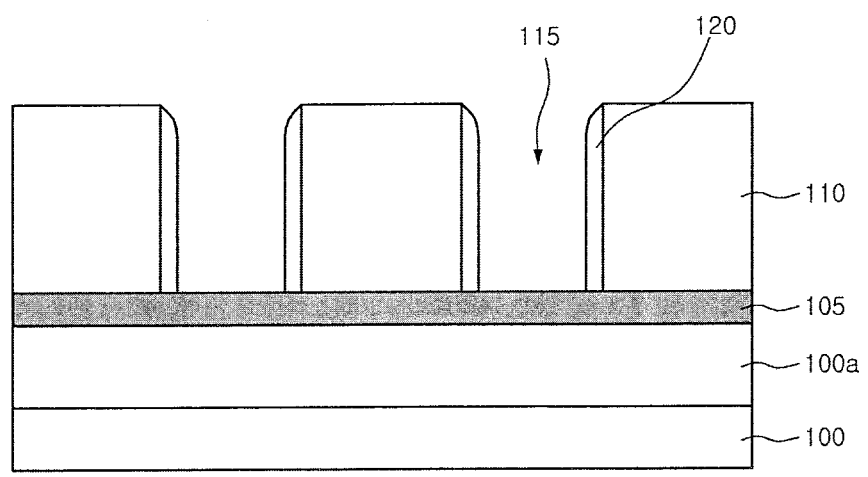

Referring to FIG. 4, sidewall spacers 120 are formed on the sidewalls of the contact holes 115. The sidewall spacers 120 are formed, for example, by depositing a dielectric layer (not shown) for spacers on the resultant semiconductor substrate 100 and subsequently anisotropically etching the dielectric layer for spacers until the first interlayer dielectric 110 and the impurity region 105 are exposed, through the anisotropic etching the dielectric layer for spacers should be formed to a thickness less than the radius (i.e., one half of the width) of the contact holes 115.

The sidewall spacers 120 are formed to prevent stacking faults from occurring at the contact interfaces of the first interlayer dielectric 110. The sidewall spacers 120 may comprise a compressive stress applying dielectric layer, that is, a dielectric layer which can apply compressive stress to the semiconductor substrate 100. For example, the sidewall spacers 120 may be formed as a silicon nitride layer or a silicon oxide layer. Even though the sidewall spacers 120 are formed as a compressive stress applying dielectric layer according to the present embodiment, a lifting or peeling phenomenon does not occur because the contact areas between the sidewall spacers 120 and the semiconductor substrate 100 are very fine. Further, stacking faults do not occur on etched surfaces even when the sidewall spacers 120 are formed through etching, because the compressive stress is applied thereto.

Figure 5:
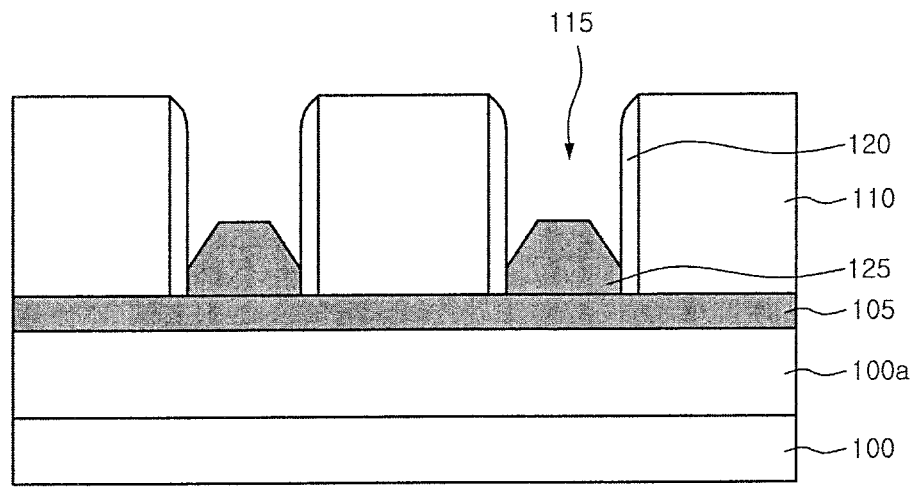

Referring to FIG. 5, a single crystal layer 125 is formed partially filling the contact holes 115 using the exposed portions of the impurity region 105 as seeds. The single crystal layer 125 may be grown to in the range of ¼ to ⅔ of the height of the contact holes 115 through SEG. The single crystal layer 125 may contain impurities having a concentration in the range of $10^{18} \sim 10^{20}$ ions/cm$^3$, or alternatively, the single crystal layer 125 may not be doped with impurities. When forming the single crystal layer 125 containing impurities, an impurity gas, for example, a phosphoric acid (PH$_3$) gas can be flowed. As is known in the art, since single crystals are grown through SEG, the SEG is conducted at a high temperature over 660° C. According to the present embodiment, stacking faults do not occur, even though the process is conducted at a high temperature process, because the sidewalls of the contact holes 115 are covered with the sidewall spacers 120 having a compressive stress applying characteristic. Moreover, the SEG processing time can be reduced when partially filling the contact holes 115, as compared to completely filling the contact holes 115, and as such a thermal burden is reduced. Also, since the contact area between the signal crystal layer 125 and the interfaces of the contact holes 115 is significantly decreased, the influence by stacking faults which may occur can be prevented.

Figure 6:
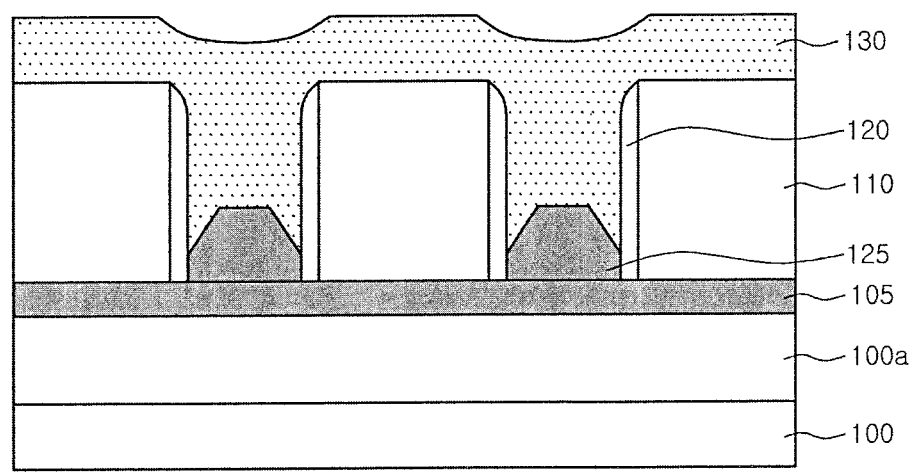

Referring to FIG. 6, an amorphous silicon layer 130 is formed on the resultant semiconductor substrate 100, having the single crystal layer 125 formed thereon, so as to completely fill the contact holes 115. The amorphous silicon layer 130 may be formed by supplying a silane (SiH$_4$) gas, a hydrogen (H$_2$) gas, and a phosphoric acid (PH$_3$) gas at a temperature in the range of 500~700° C. for a duration in the range of 0.2 to 2 hours. The phosphoric acid (PH$_3$) gas determines the impurity concentration of the amorphous silicon layer 130. Therefore, the supply amount of the phosphoric acid (PH$_3$) gas is determined in consideration of the is desired impurity concentration of the underlying single crystal layer 125.

Figure 7:
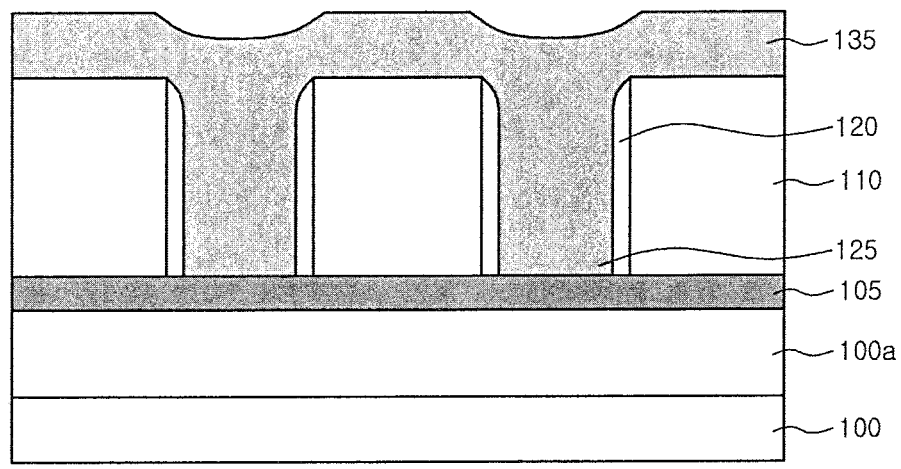

Referring to FIG. 7, a single crystal epitaxial layer 135 is formed by annealing the amorphous silicon layer 130 and the single crystal layer 125 formed in the contact holes 115. The annealing can be conducted as a process for single-crystallizing the amorphous silicon layer 130 by supplying an inert gas at a temperature in the range of 500~700° C.

Figure 8:
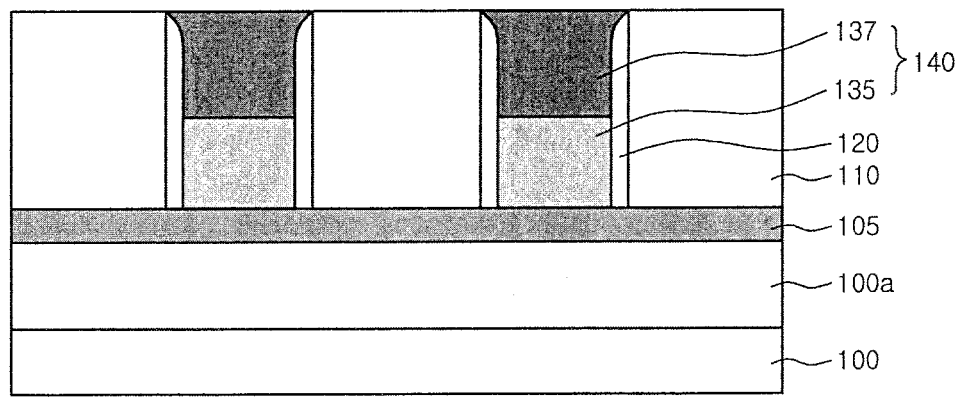

Referring to FIG. 8, the single crystal epitaxial layer 135 is planarized until the surface of the first interlayer dielectric 110 is exposed. Through the planarization process, the single crystal epitaxial layer 135 is filled in the contact holes 115 in the form of plugs. The planarization process may be conducted, for example, as a chemical mechanical polishing process. Here, the single crystal epitaxial layer 135 has an N impurity type due to the doping of the phosphoric acid ($PH_3$) gas as described above. By implanting P-type impurities, for example, boron (B) or boron fluoride ($BF_2$) ions, into the single crystal epitaxial layer 135, having the N impurity type, to a concentration in the range of $10^{20}$~$10^{22}$ ions/$cm_3$ with an energy in the range of 10~50 KeV, PN diodes 140 are formed. Here, the unexplained reference numeral 137 designates the P-type impurity regions of the PN diodes 140 formed through the steps described above.

Figure 9:
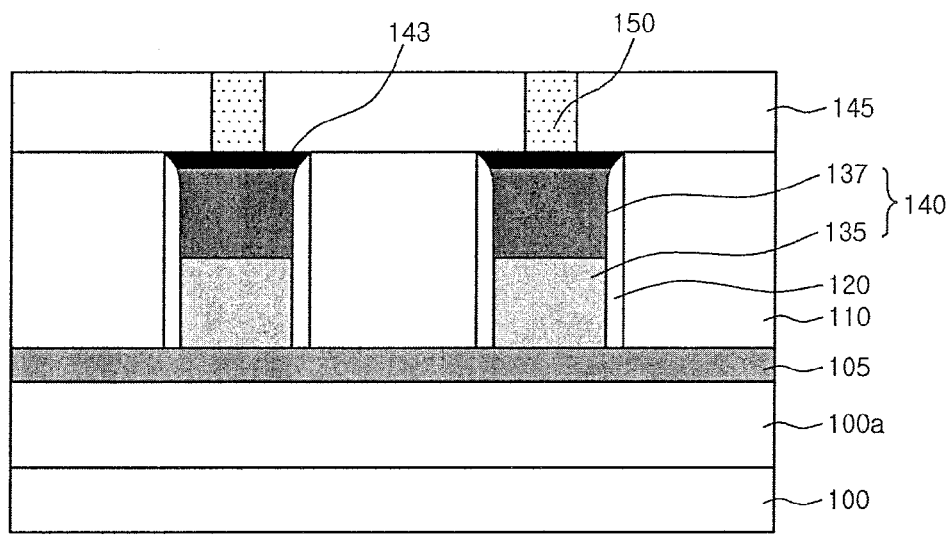

Referring to FIG. 9, an ohmic contact layer 143 is formed on the PN diodes 140 through a process well known in the art, and subsequently a second interlayer dielectric 145 is formed on the first interlayer dielectric 110 and the PN diodes 140 formed therein. The second interlayer dielectric 145 isolates heater electrodes, which will be subsequently formed, and may comprise a material having excellent heat resistance, for example silicon nitride layer. Subsequently, the second interlayer dielectric 145 is selectively etched until the ohmic contact layer 143 on the surfaces of the PN diodes 140 is exposed, so as to define contact holes (not shown) for heater electrodes. A conductive layer is deposited to fill the contact holes for heater electrodes, and subsequently the conductive layer is planarized so as to form heater electrodes 150. The heater electrodes 150 serve as media for generating Joule heat when current is transmitted from the PN diodes 140 to a phase change material layer which will be subsequently formed. The heater electrodes 150 may comprise a conductive layer having high specific resistance, for example, a titanium nitride layer, a titanium aluminum nitride layer, a titanium tungsten layer, a polysilicon layer, or a silicon germanium layer. In the present embodiment, the heater electrode 150 is formed to have a thickness in the range of 400~600 Å for easy heat transfer.

Thereupon, after a phase change material layer and a conductive layer for top electrodes are sequentially deposited on the second interlayer dielectric 145. Phase change patterns 155 and top electrodes 160 are formed at locations corresponding to the heater electrodes 150 (see FIG. 1) by patterning the phase change material layer and the conductive layer for top electrodes.

The phase change material layer may be formed of a chalcogen compound which may comprise germanium-stibium-tellurium (GST), arsenic-stibium-tellurium, tin-stibium-tellurium, tin-indium-stibium-tellurium, arsenic-germanium-stibium-tellurium, 5A group element, such as tantalum, niobium or vanadium, -stibium-tellurium, 6A group elements, such as tungsten, molybdenum or chrome, -stibium-tellurium, 5A group element-stibium-selenium, and 6A group element-stibium-selenium. According to an embodiment of the present invention, the phase change material layer may be formed to a thickness in the range of 100~1,000 Å using germanium-stibium-tellurium (GST). Also, the phase change material layer may contain impurities such as oxygen ($O_2$), nitrogen ($N_2$), or silicon (Si) so that the properties of the phase change material thereof can be improved.

Furthermore, the conductive layer for top electrodes may comprise a titanium nitride layer, a titanium aluminum nitride layer, or a titanium tungsten layer.

In the present embodiment, after the single crystal layer 125 and the amorphous silicon layer 130 are formed, the single crystal layer 125 and the amorphous silicon layer 130 are phase-changed to the single crystal epitaxial layer 135, and then, the PN diodes 140 are formed.

Figure 10:
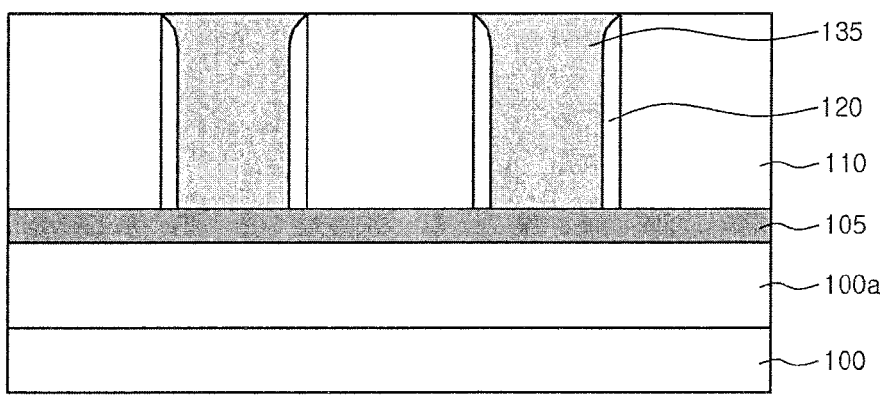
FIG. 10 is a cross-sectional view shown for illustrating a method for manufacturing a phase change memory device according to still another embodiment of the present invention.

However, the invention is not limited to the above embodiment, and it should be understood that a silicon epitaxial layer 135 may be directly formed in contact holes 115 as shown in FIG. 10.

Further, while the present embodiment was exemplified with respect to a phase change memory device, it should be understood that the inventive principles described above can be applied to the interlayer dielectrics of all semiconductor devices in which contact structures are formed by growth.

Although exemplary embodiments have been described for illustrative purposes, those skilled in the art will appreciate that various modifications, additions, and substitutions are possible, without departing from the scope and the spirit as disclosed in the accompanying claims.

What is claimed is:

1. A method for manufacturing a phase change memory device, comprising the steps of:
   forming an interlayer dielectric applying a tensile stress on a semiconductor substrate, the semiconductor substrate having an impurity region;
   patterning predetermined portions of the interlayer dielectric to define contact holes exposing the impurity region;
   forming sidewall spacers on sidewalls of the contact holes, wherein the sidewall spacers are formed as a dielectric layer applying compressive stress;
   forming switching elements in the contact holes;
   after the step of forming the switching elements, forming an upper interlayer dielectric and heater electrodes on the interlayer dielectric;
   forming phase change patterns on the upper interlayer dielectric, the phase change patterns electrically connected to the heater electrodes; and
   forming top electrodes on the phase change patterns,
   wherein the interlayer dielectric is formed to apply the tensile stress to the semiconductor substrate, and the sidewall spacers are formed as a dielectric layer applying the compressive stress to the semiconductor substrate.

2. The method according to claim 1, wherein the step of forming the interlayer dielectric comprises the step of:
   depositing a layer comprising at least one of a boro-phosphor silicate glass (BPSG), a phosphor silicate glass (PSG), an undoped silicate glass (USG), and a flowable oxide (FOX) on the semiconductor substrate, wherein the layer is deposited to a thickness corresponding to a predetermined thickness of the switching elements.

3. The method according to claim 1, wherein the step of forming the sidewall spacers comprises the steps of:
   depositing a dielectric layer on the interlayer dielectric having the contact holes defined therein to a thickness less than a radius of the contact holes, wherein the dielectric layer applies a compressive stress; and
   etching anisotropically the dielectric layer until a surface of the interlayer dielectric and the impurity region are exposed.

4. The method according to claim 1, wherein the step of forming the switching elements comprises the steps of:
   filling an N-type single crystal epitaxial layer in the contact holes; and
   forming a P-type impurity region in an upper portion of the N-type single crystal epitaxial layer.

5. The method according to claim 4, wherein the step of filling the N-type single crystal epitaxial layer comprises the steps of:

growing a single crystal layer through selective epitaxial growth to a height in the range of ¼ to ⅔ of a height of the contact holes;

forming an amorphous layer on the single crystal layer to completely fill the contact holes; and crystallizing the single crystal layer and the amorphous layer.

6. The method according to claim 5, wherein the step of growing the single crystal layer further comprises the step of supplying an N-type impurity gas.

7. The method according to claim 5, wherein the step of forming the amorphous layer comprises the step of supplying an impurity gas at a temperature lower than that at which the single crystal layer is grown.

8. The method according to claim 5, wherein the crystallizing step comprises the step of annealing the single crystal layer and the amorphous layer at a temperature in the range of 500~700° C. using an inert gas.

9. The method according to claim 5, further comprising the step of:

after the crystallizing step, planarizing the single crystal epitaxial layer until the interlayer dielectric is exposed.

10. A method for manufacturing a phase change memory device, comprising the steps of:

forming an interlayer dielectric on a silicon-containing substrate to apply tensile stress to the silicon-containing substrate, the silicon-containing substrate having an impurity region;

patterning predetermined portions of the interlayer dielectric to define contact holes exposing the impurity region;

forming sidewall spacers on sidewalls of the contact holes, wherein the sidewall spacers are formed as a dielectric layer applying compressive stress to the silicon-containing substrate;

forming a single crystal layer to at least partially fill the contact holes, wherein the single crystal layer is formed through selective epitaxial growth employing exposed portions of the impurity region as seeds;

forming an amorphous silicon layer on the single crystal layer to completely fill the contact holes;

annealing the single crystal layer and the amorphous silicon layer to form a single crystal epitaxial layer;

planarizing the single crystal epitaxial layer until the interlayer dielectric is exposed; and implanting impurities into the single crystal epitaxial layer to form PN diodes.

\* \* \* \* \*